United States Patent
Sura et al.

(10) Patent No.: US 9,669,713 B2
(45) Date of Patent: Jun. 6, 2017

(54) VEHICLE WITH AN AUXILIARY POWER PACK

(71) Applicant: Nissan North America, Inc., Franklin, TN (US)

(72) Inventors: Bhargav Sura, Sterling Heights, MI (US); Randall Johnson, White Lake, MI (US); Quan Cat, Canton, MI (US); Nelson Phan, Rochester Hills, MI (US); Sonia Rief, Milford, MI (US)

(73) Assignee: Nissan North America, Inc., Franklin, TN (US)

( * ) Notice: Subject to any disclaimer, the term of this patent is extended or adjusted under 35 U.S.C. 154(b) by 458 days.

(21) Appl. No.: 14/197,285

(22) Filed: Mar. 5, 2014

(65) Prior Publication Data
US 2015/0251539 A1    Sep. 10, 2015

(51) Int. Cl.
*B60L 1/00* (2006.01)
*B60L 3/00* (2006.01)
*H02G 3/00* (2006.01)
*H02S 40/38* (2014.01)
*H02S 20/30* (2014.01)
*B60L 8/00* (2006.01)
(Continued)

(52) U.S. Cl.
CPC ............... *B60L 1/20* (2013.01); *B60L 1/006* (2013.01); *B60L 8/00* (2013.01); *H01L 31/048* (2013.01); *H02S 20/30* (2014.12); *H02S 40/38* (2014.12); *H02K 7/18* (2013.01); *Y02T 10/641* (2013.01); *Y02T 10/7083* (2013.01); *Y02T 90/16* (2013.01)

(58) Field of Classification Search
CPC ...... B60L 11/182; B60L 1/00; B60L 11/1803; B60L 11/18; B60L 11/1824; B60L 11/02; B60L 11/12; B60L 2210/40; B60L 3/00; B60L 11/1805; B60L 11/1846; B60L 2210/14; B60L 2210/30; B60L 11/1811
USPC ........................................................ 307/9.1
See application file for complete search history.

(56) References Cited

U.S. PATENT DOCUMENTS 6,532,398 B2 *  3/2003  Matsumoto ........... B60P 1/6445
                                                                290/1 A
7,484,784 B2    2/2009  Ohly
7,533,920 B2    5/2009  Ohly
(Continued)

FOREIGN PATENT DOCUMENTS

EP            1396388 A1    3/2004

OTHER PUBLICATIONS

Sun Table: Basking in Solar's Warm Glowing Warming Glow, http://www.treehugger.com/sustainable-product-design/sun-table-basking-in-solars-warm-glowing-warming-glow, Dec. 18, 2007.

*Primary Examiner* — Jared Fureman
*Assistant Examiner* — Esayas Yeshaw
(74) *Attorney, Agent, or Firm* — Young Basile Hanlon & MacFarlane, P.C.

(57) ABSTRACT

An auxiliary power pack for a vehicle includes an energy harvesting system for converting energy from an ambient environment into electrical power, a storage device in communication with the energy harvesting device for storing energy in response to the electrical power, and an output interface in communication with the storage device for supplying the stored energy to an electronic device. The power pack further includes a portable housing for the energy harvesting system, the storage device and the output interface. The housing is configured for removable mounting to a vehicle.

17 Claims, 4 Drawing Sheets

(51) Int. Cl.
*H01L 31/048* (2014.01)
*H02K 7/18* (2006.01)

(56) References Cited

U.S. PATENT DOCUMENTS

| | | | |
|---|---|---|---|
| 7,605,689 B2 | 10/2009 | Hein et al. | |
| 7,625,031 B2 | 12/2009 | Ohly | |
| 7,905,532 B2 | 3/2011 | Johnson | |
| 7,936,113 B2 | 5/2011 | Namuduri et al. | |
| 7,986,076 B2 | 7/2011 | Yoon et al. | |
| 8,063,498 B2 | 11/2011 | Namuduri et al. | |
| 8,143,766 B2 | 3/2012 | Namuduri et al. | |
| 8,160,774 B2 | 4/2012 | Li et al. | |
| 8,253,281 B2 | 8/2012 | Namuduri et al. | |
| 8,311,693 B2 | 11/2012 | Wu et al. | |
| 2007/0205881 A1 | 9/2007 | Breed | |
| 2009/0079161 A1* | 3/2009 | Muchow | F03D 1/001 280/400 |
| 2009/0166108 A1* | 7/2009 | Gross | B60L 11/126 180/65.21 |
| 2011/0308574 A1* | 12/2011 | Vaidyanathan | H01L 31/0504 136/246 |
| 2012/0201016 A1* | 8/2012 | Robertson | F21L 4/08 362/183 |
| 2012/0235477 A1* | 9/2012 | Korman | H01L 31/042 307/11 |
| 2013/0037080 A1* | 2/2013 | Helfan | F24J 2/523 136/245 |
| 2013/0231808 A1* | 9/2013 | Flath | B60W 10/30 701/22 |
| 2014/0116077 A1* | 5/2014 | Pierce | B60L 1/02 62/235.1 |
| 2015/0246649 A1* | 9/2015 | Brunbauer | H02K 7/1815 307/9.1 |

\* cited by examiner

VEHICLE WITH AN AUXILIARY POWER PACK

TECHNICAL FIELD

The embodiments disclosed herein generally relate to generation and supply of electrical power in vehicles.

BACKGROUND

Many if not all vehicles have an electrical system that includes a battery for storing energy. The electrical systems in these vehicles can be used to supply electrical power to a variety of electronic devices, such as those of a powered vehicle accessory. The electrical systems in some vehicles further include electrical sockets or other componentry to support the connection and powering of a user's electronic devices. In these vehicles, supplying electrical power to powered vehicle accessories and connecting electronic devices to the electrical sockets for powering draws down the vehicle's primary battery, results in the consumption of other energy reserves, or both.

SUMMARY

Disclosed herein are embodiments of a vehicle with an auxiliary power pack.

In one aspect, an auxiliary power pack for a vehicle includes an energy harvesting system for converting energy from an ambient environment into electrical power, a storage device in communication with the energy harvesting device for storing energy in response to the electrical power, and an output interface in communication with the storage device for supplying the stored energy to an electronic device. The power pack further includes a portable housing for the energy harvesting system, the storage device and the output interface. The housing is configured for removable mounting to a vehicle.

In another aspect, a vehicle includes a vehicle member defining a base and a portable power pack removably mounted to the base. The power pack includes an energy harvesting system for converting energy from an ambient environment into electrical power, a storage device in communication with the energy harvesting device for storing energy in response to the electrical power, and an output interface in communication with the storage device for supplying the stored energy to an electronic device.

In yet another aspect, a vehicle includes a vehicle body member configured for removable attachment from a remainder of the vehicle, a powered vehicle accessory including at least one electronic device supported by the vehicle body member, and a power pack removably mounted to the vehicle body member. The power pack includes an energy harvesting system for converting energy from an ambient environment into electrical power, and a storage device in communication with the energy harvesting device for storing energy in response to the electrical power. The vehicle further includes a disconnectable electrical coupling between the storage device and the electrical device of the powered vehicle accessory.

These and other aspects will be described in additional detail below.

BRIEF DESCRIPTION OF THE DRAWINGS

The various features, advantages and other uses of the present apparatus will become more apparent by referring to the following detailed description and drawings in which.

DETAILED DESCRIPTION

The vehicle according to the following description includes an auxiliary power pack. The power pack can be configured for supplying electrical power to operate vehicle accessories and/or other electronic devices. In the described examples, the vehicle, the power pack, or both may include energy harvesting devices so that the power pack can be charged in whole or in part without drawing down the vehicle's primary battery or consuming other of the vehicle's energy reserves. In addition, the power pack can be packaged for portability, such that a user can use the power pack to power electronic devices remotely from the vehicle.

Figure 1:
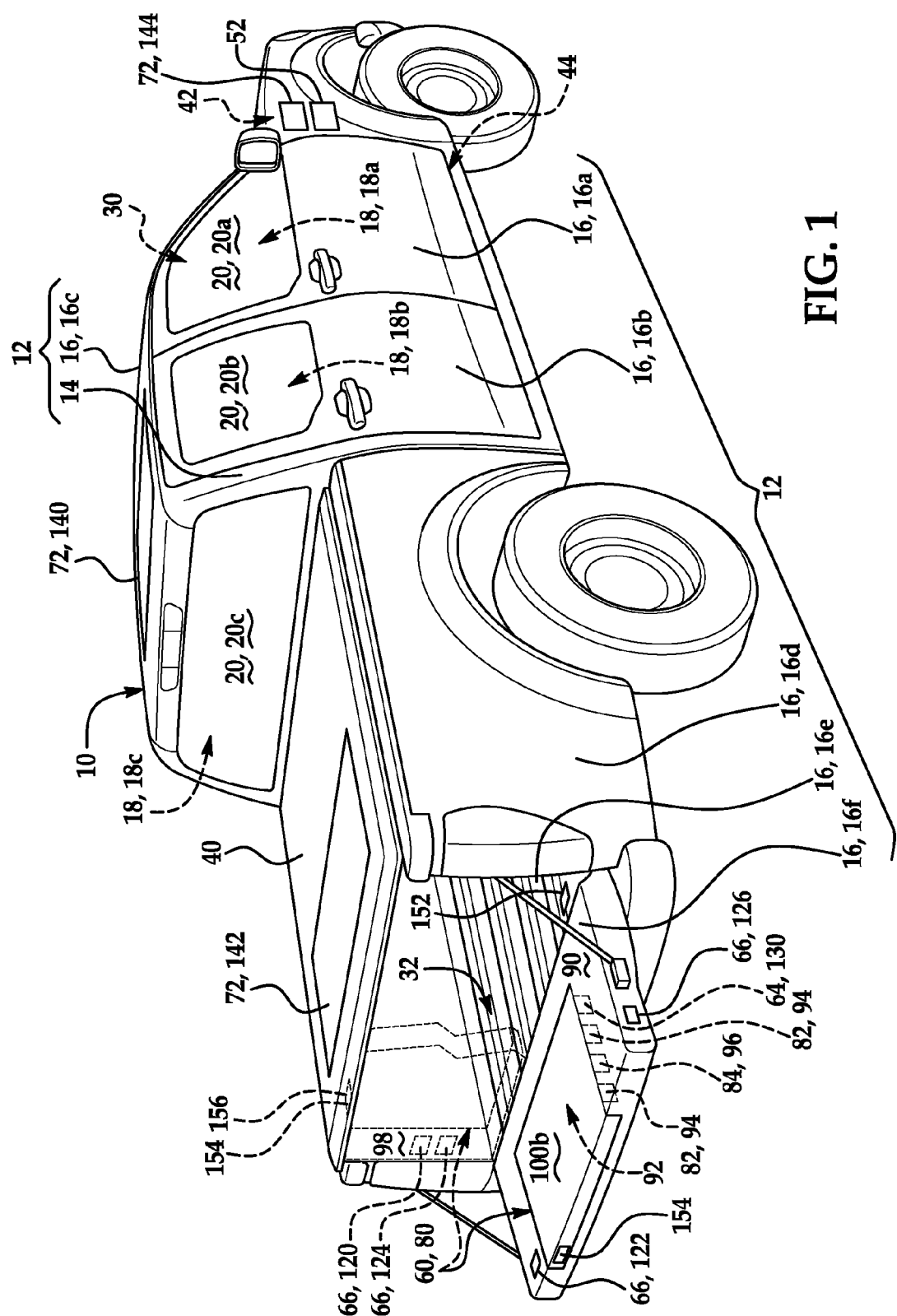
FIG. 1 is a perspective view of a vehicle with an auxiliary power pack.

A representative vehicle 10 is shown in FIG. 1. The vehicle 10 has a vehicle body structure 12, which is generally comprised of a number of frame members 14 and vehicle body members 16, and is at least partially open to define one or more window openings 18. In this description, references to a frame member 14 or a vehicle body member 16 should be understood as encompassing structural components as well as any exterior or interior panels, upholstery or trim pieces.

The window openings 18 are each sized and shaped to accommodate a respective window panel 20 that, together with the frame members 14, the vehicle body members 16 and other window panels 20, defines an interior 30 of the vehicle 10. The vehicle body members 16 viewable in FIG. 1 include a front passenger's side door 16a and a rear passenger's side door 16b. The side doors 16a and 16b are pivotally connected to the vehicle body structure 12 as closure panels that permit ingress to and egress from the interior 30 of the vehicle 10.

As shown, the window opening 18a is defined within the side door 16a and the window opening 18b is defined within the side door 16b. Similarly, the window opening 18c is defined in part by the frame member 14 and a roof 16c of the vehicle body members 16. The window panels 20 include a window panel 20a configured as a front passenger's side window, a window panel 20b configured as a rear passenger's side window and a window panel 20c configured as a rear window. The window panels 20a, 20b and 20c may be fixed, or may be retractable or otherwise moveable with respect to the vehicle body structure 12 to expose their respective window openings 18a, 18b and 18c.

The vehicle 10 is generally configured as a pickup truck. According to this example, the vehicle body members 16 of the vehicle 10 further include an upright rear fender 16d extending from a transverse floor 16e defining in part an open top bed 32 of the vehicle 10. As shown, a tailgate 16f is pivotally connected to the vehicle body structure 12 at the rear of the bed 32. The tailgate 16f is configured as a closure panel for the bed 32 that partially defines the bed 32 when secured in a closed upright position, and pivots down to an open position. In the open position, the tailgate 16f is positioned in a transverse orientation generally in the plane of the floor 16e to permit the loading of cargo into the bed 32. The vehicle 10 may include other fixed or removable structures in addition to those forming the vehicle body structure 12. For instance, for the example vehicle 10 configured as a pickup truck, the vehicle 10 could include a tonneau cover 40 for covering the bed 32.

Figure 2:
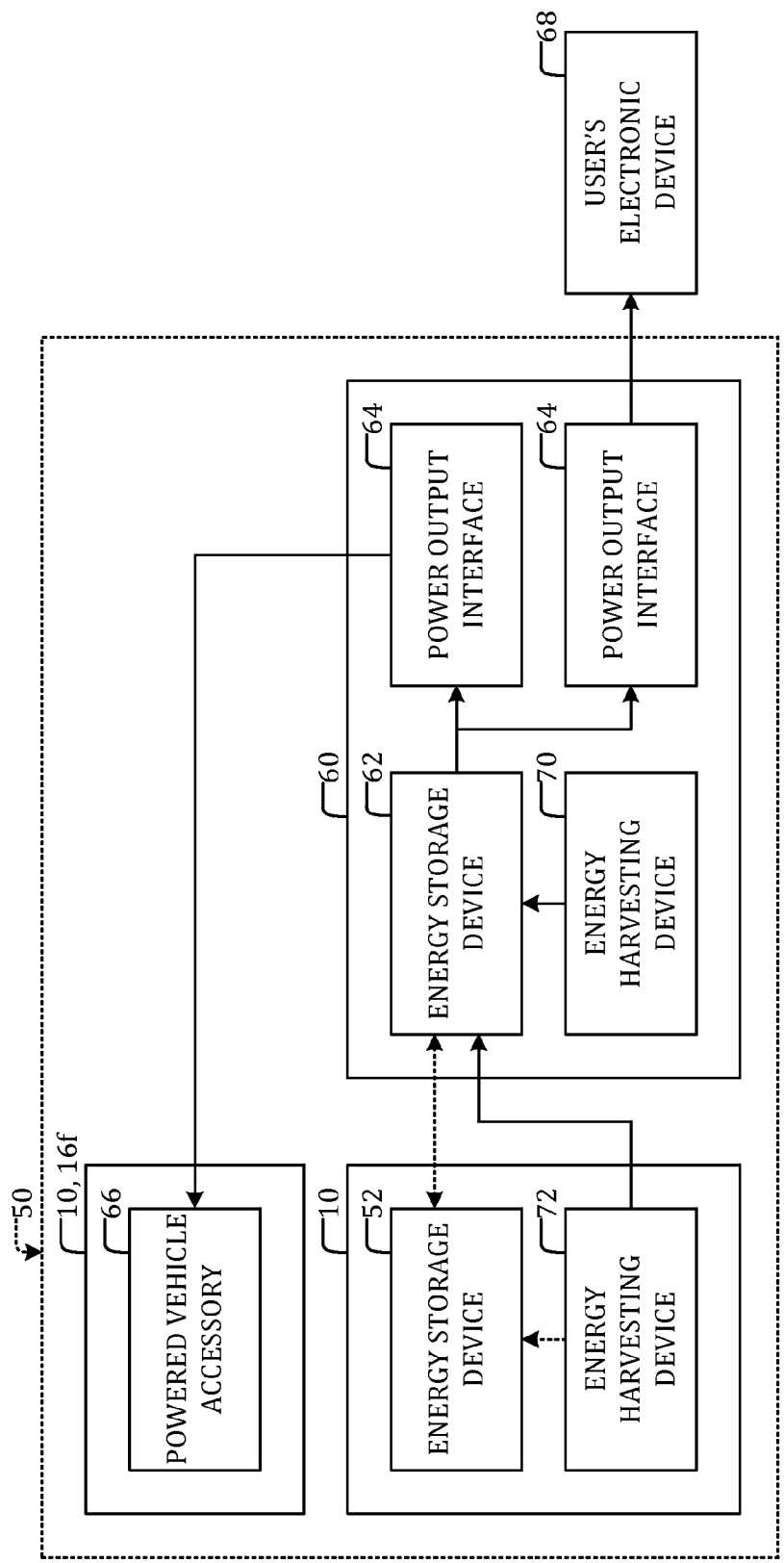
FIG. 2 is a schematic diagram showing an electrical system for the vehicle and the power pack.

With additional reference to FIG. 2, the vehicle 10 further includes an electrical system 50 that, as shown, includes an energy storage device 52 installed to the vehicle 10. The energy storage device 52 can be or include one or more batteries or other devices, such as capacitors, that are generally configured for storing energy. The stored energy can be drawn from the energy storage device 52 in the form of electrical power. In the vehicle 10, the energy storage device 52 is representative of a primary source of electrical power used to support the general operation of the vehicle 10. As shown, the energy storage device 52 can be installed to the vehicle 10 within an engine compartment 42 generally defined by the vehicle body structure 12. Additionally, or alternatively, the energy storage device 52 could be installed to the vehicle 10 at other locations, such as at an undercarriage 44 of the vehicle body structure 12, for example.

In the illustrated vehicle 10, the electrical system 50 further includes the components of an auxiliary power pack 60. As explained in greater detail below, the power pack 60 is generally configured as an additional or alternative source of electrical power for supporting certain aspects of the operation of the vehicle 10 and the powering of a user's electronic devices.

The power pack 60 includes an energy storage device 62. Similarly to the energy storage device 52 installed to the vehicle 10, the energy storage device 62 can be or include one or more batteries or other devices, such as capacitors, that are generally configured for storing energy. In operation, the stored energy can be drawn from the energy storage device 62 in the form of electrical power.

As generally shown, the energy storage device 62 is in electrical communication with at least one power output interface 64. Each of the included power output interfaces 64 is configured to support an electrical coupling between the energy storage device 62 and an electronic device.

In one example, a power output interface 64 is configured to support an electrical coupling between the energy storage device 62 and an electronic device included with a powered vehicle accessory 66 of the vehicle 10. In another example, a power output interface 64 is configured to support an electrical coupling between the energy storage device 62 and a separate user's electronic device 68. Once electrically coupled to the energy storage device 62, the electronic devices of the powered vehicle accessory 66, or the user's electronic device 68, can draw stored energy from the energy storage device 62 in the form of electrical power for operation. It will be understood that a given power output interface 64 may incorporate componentry for converting the energy drawn from the energy storage device 62 into a usable form of electrical power for a respective powered vehicle accessory 66 or a user's electronic device 68.

In the vehicle 10, the electrical system 50 further includes at least one energy harvesting device in electrical communication with the energy storage device 62. The energy harvesting device can reduce or eliminate the dependence upon the energy storage device 52 installed to the vehicle 10 for the supply of electrical power.

According to one example implementation of the electrical system 50, the power pack 60 can include one or more energy harvesting devices 70. Each of the included energy harvesting devices 70 can be configured to convert energy from an ambient environment into electrical power usable to charge the energy storage device 62. The included energy harvesting devices 70 may be collectively configured to convert one or more of vibration energy, thermal energy, solar energy, wave energy, wind energy or magnetic energy into electrical power, for example. In this example implementation, the power pack 60 is generally configured for the self-contained generation and supply of electrical power usable to operate the electronic devices included with one or more powered vehicle accessories 66 of the vehicle 10 and/or one or more of a user's electronic devices 68.

Additionally, or alternatively, one or more energy harvesting devices 72 can be included with the vehicle 10 separately from the power pack 60. Each of the included energy harvesting devices 72, similarly to the energy harvesting devices 70, can be configured to convert one or more of vibration energy, thermal energy, solar energy, wave energy, wind energy or magnetic energy, for example, from an ambient environment into electrical power.

As shown, a given energy harvesting device 72 can be electrically coupled with the energy storage device 62 of the power pack 60 to supply electrical power for charging the energy storage device 62. This electrical coupling, for instance, can be made directly between the energy harvesting device 72 and the energy storage device 62. Alternately, the energy harvesting device 72 can be electrically coupled with the energy storage device 52 of the vehicle 10 to supply electrical power for charging the energy storage device 52, which in turn can be can be electrically coupled with the energy storage device 62 of the power pack 60 to supply electrical power for charging the energy storage device 62. An electrical coupling between the energy storage device 52 of the vehicle 10 and the energy storage device 62 of the power pack 60 could also be used for the supply electrical power between the energy storage device 62 and the energy storage device 52 in other implementations of the electrical system 50. For instance, in an implementation not having an energy harvesting device 72 included with the vehicle 10, the energy storage device 52 could supply electrical power for topping off the charge on the energy storage device 62, or vice versa.

Figure 3:
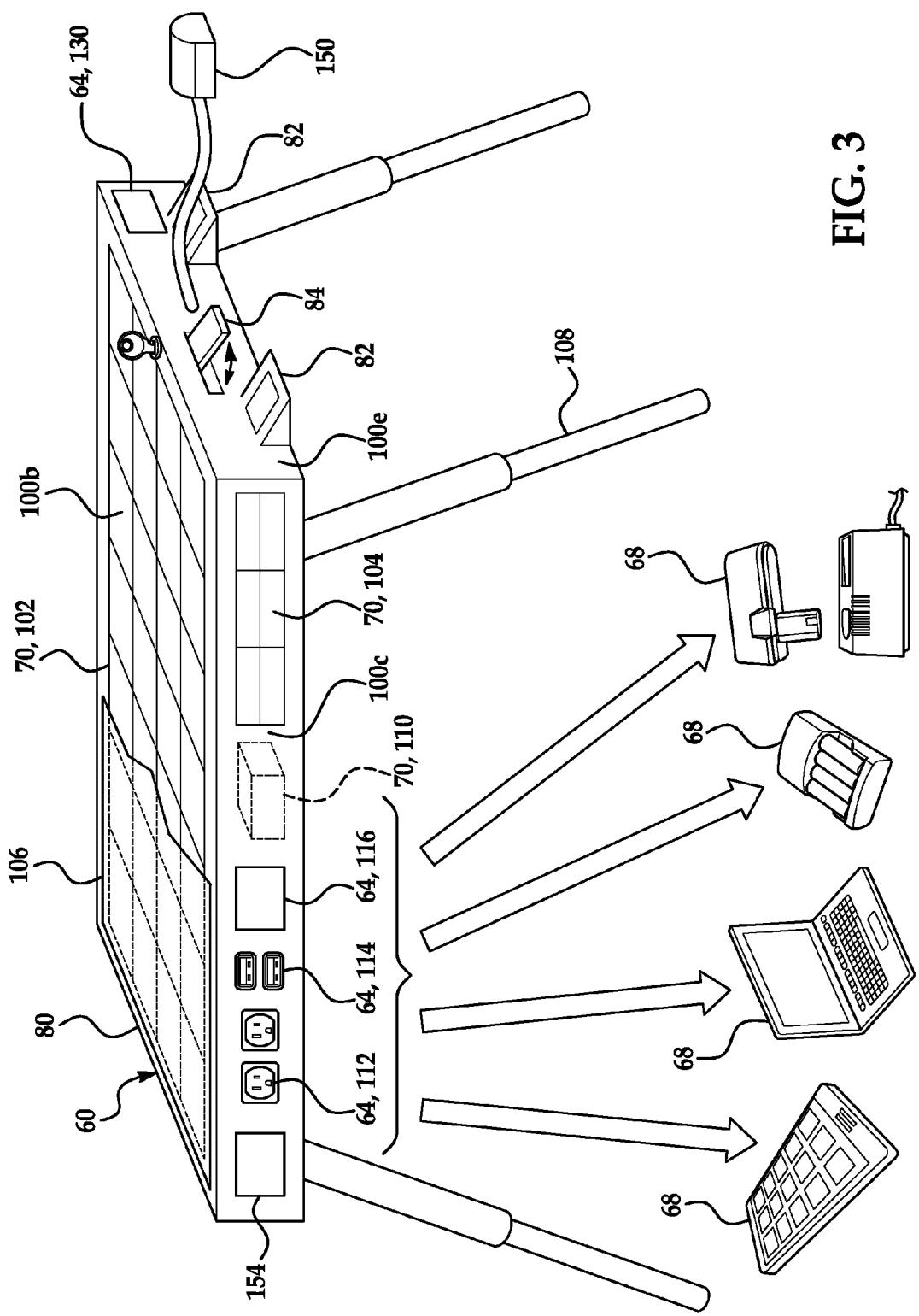
FIGS. 3 and 4 are perspective views of the power pack.
Figure 4:
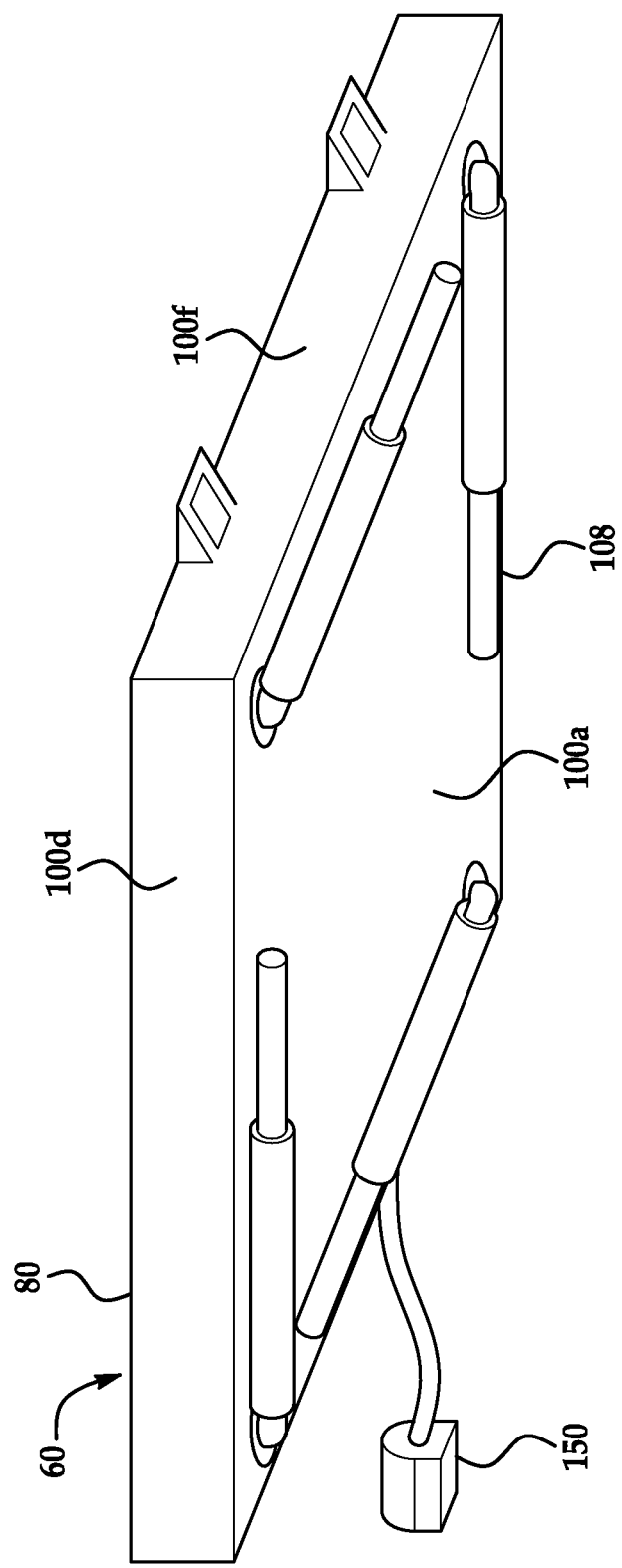

As shown in FIG. 1 and explained with additional reference to FIGS. 3 and 4, in one example implementation of the vehicle 10 having a power pack 60, the components of the power pack 60 can be packaged as a unit within a housing 80. Moreover, the housing 80 may be removably mounted to the vehicle 10 and configured for portability by a user. In this example, the power pack 60 can be mounted at any location about the vehicle 10 that allows a user to access the power pack 60 for removal from the vehicle 10. The power pack 60 may be mounted, for instance, at locations about the exterior of the vehicle body structure 12, including for instance on or within a frame member 14, a vehicle body member 16 or the undercarriage 44 of the vehicle body structure 12. The power pack 60 could alternatively be mounted, for instance, in the interior 30 of the vehicle 10 or in the engine compartment 42.

In the illustrated non-limiting example of the vehicle 10, the power pack 60 is removably mounted with respect to the tailgate 16f. In this example, an inside surface 90 of the tailgate 16f defines a base 92 configured for receiving the power pack 60. The housing 80 of the power pack 60 and the base 92 of the tailgate 16f may respectively include or define complementary structures for removably mounting the housing 80 to the base 92. In the illustrated example, for instance, the housing 80 includes one or more tabs 82, and the base 92 defines corresponding recesses 94 for receiving the tabs 82 with a snap-fit connection.

The housing 80 and the base 92 may also define a locking mechanism for selectively securing the housing 80 in a mounted position with respect to the base 92. For instance, as shown, the housing 80 includes a latch 84 that can be selectively extended and retracted from the housing 80, and the base 92 defines corresponding recess 96 for receiving the latch 84 in its extended position. The locking mechanism may be manually actuated with a key, as generally shown, or with other devices. Alternatively, the locking mechanism could be configured for automatic actuation.

The overall configuration of the housing 80 of the power pack 60 and the mounting of the housing 80 to the base 92 of the tailgate 16*f* can be coordinated with the selective inclusion and/or location of the above described components of the electrical system 50 of the vehicle 10.

In the illustrated example, the housing 80 of the power pack 60 is generally rectangular and defines six faces 100*a-f*. As will be understood with reference to FIGS. 1, 3 and 4, when the housing 80 is mounted to the base 92, a bottom face 100*a* and adjacent side faces 100*d*, 100*e* and 100*f* are configured for nesting against corresponding portions of the base 92, while an upper face 100*b* defines a generally planar surface that lies contiguously with the inside surface 90 of the tailgate 16*f*, and a remaining side face 100*c* lies contiguously with an upper lip of the inside surface 90.

The energy harvesting devices 70 included with the power pack 60 in this example may include a solar panel 102 generally spanning the upper face 100*b* of the housing 80 and a solar panel 104 located along the side face 100*c*. The solar panel 102 and the solar panel 104 are each configured to convert ambient solar energy into electrical power usable to charge the energy storage device 62. The solar panel 102 can receive a certain amount of solar energy with the tailgate 16*f* in its closed position, and also, can be positioned in a transverse orientation to receive solar energy with the tailgate 16*f* in its open position. Conversely, the solar panel 104 can receive a certain amount of solar energy with the tailgate 16*f* in its open position, and can be positioned in a transverse orientation to receive solar energy with the tailgate 16*f* in its closed position.

As shown, the housing 80 can include a durable covering 106 for the solar panel 102 at the upper face 100*b*. The covering 106 may be composed of a suitable light transmitting material, such as acrylic, for example. Additionally, with the power pack 60 removed from the vehicle 10, it will be understood that a user can use the generally planar surface defined by the upper face 100*b* as a work surface. In support of this functionality, as shown, the power pack 60 can include telescoping legs 108 at the bottom face 100*a* that can extend from the housing 80 to support the power pack 60 at a workable height above ground level. The legs 108 can be generally foldable into the housing 80, as shown, or otherwise retractable with respect to the housing 80.

Additional energy harvesting devices 70 can be included with the power pack 60 depending upon the availability of ambient energy at the location of the power pack 60 and the practicability of converting the available ambient energy into electrical power. In furtherance of the example where the power pack 60 is removably mounted with respect to the tailgate 16*f* of the vehicle 10, an additional energy harvesting device 110 could be, for instance, a microelectromechanical systems (MEMS) device configured to convert ambient vibration energy into electrical power usable to charge the energy storage device 62.

The power pack 60, as described above, may include multiple power output interfaces 64 that are each configured to support an electrical coupling between the energy storage device 62 and a separate user's electronic device 68. In the illustrated example of the power pack 60, the power output interfaces 64 are located at the side face 100*c* for accessibility either when the power pack 60 is removed from the tailgate 16*f* or when the power pack 60 is mounted to the base 92 of the tailgate 16*f*. As shown by way of non-limiting examples, the power output interfaces 64 can include sockets 112 and USB ports 114 configured to support a conductive terminal connection between the energy storage device 62 and a user's electronic device 68. As shown by way of a further non-limiting example, the power output interfaces 64 can include an inductive pad 116 configured to support a non-conductive electrical coupling between the energy storage device 62 and a user's electronic device 68.

In addition, the power pack 60 may include one or more power output interfaces 64 that are configured to support a disconnectable electrical coupling between the energy storage device 62 and an electronic device included with a powered vehicle accessory 66 of the vehicle 10. Non-limiting examples of powered vehicle accessories 66 shown in FIG. 1 include, for instance, a light 120 located at an outside surface 98 of the tailgate 16*f* for illuminating an area surrounding the vehicle 10, a light 122 located at the inside surface 90 of the tailgate 16*f* for illuminating the bed 32, a backup camera 124, and a powered lock 126 configured in whole or in part to lock the tailgate 16*f* in its closed position. In the illustrated example of the power pack 60, an inductive pad 130 configured to support a non-conductive and disconnectable electrical coupling between the energy storage device 62 and the powered vehicle accessories 66 is located at the side face 100*e*. Alternatively, it will be understood that a power output interface 64 configured to support a disconnectable conductive terminal connection between the energy storage device 62 and the powered vehicle accessories 66 could be used, either at the side face 100*e* or at other locations.

The above described example implementation where the power pack 60 is generally configured for the self-contained generation and supply of electrical power by its inclusion of one or more energy harvesting devices 70 has the advantage that a user's electronic device 68 can draw stored energy from the energy storage device 62 for operation when the power pack 60 is removed from the vehicle 10.

An additional example advantage is that localized powered vehicle accessories 66 can draw stored energy from the energy storage device 62 for operation without requiring an electrical coupling to the energy storage device 52 installed to the vehicle 10. For instance, in the illustrated non-limiting example of the vehicle 10, the described examples of the light 120, the light 122, the backup camera 124 and the powered lock 126 are generally included in the tailgate 16*f*. Further, in this example, the power pack 60 is mounted with respect to the tailgate 16*f*, and the power output interface 64 supports a local electrical coupling between the energy storage device 62 and the electronic devices included with the powered vehicle accessories 66.

With this implementation, all or selected of the powered vehicle accessories 66 included in the tailgate 16*f* can draw stored energy from the energy storage device 62 for operation, and the cost of making an electrical coupling from the tailgate 16*f* to the remainder of the vehicle 10 can be obviated with respect to these powered vehicle accessories 66. This can be particularly advantageous, for instance, where the tailgate 16*f* is removable from the vehicle body structure 12 of the vehicle 10. Although this advantage is described with reference to the removable tailgate 16*f*, it will be understood that the advantage of obviating the cost of making an electrical coupling from the location of the mounted power pack 60 to the remainder of the vehicle 10 could be applicable in connection with many different portions of the vehicle body structure 12, including without limitation the side door 16*a*, the side door 16*b* or the tonneau cover 40 of the illustrated vehicle 10, or for instance a liftgate or a sliding door in other examples of the vehicle 10.

As described above, one or more energy harvesting devices 72 can also be included with the vehicle 10 separately from the power pack 60. According to the illustrated example of the vehicle 10, the energy harvesting devices 72 may include a solar panel 140 located at the roof 16c of the vehicle 10 or a solar panel 142 located at the tonneau cover 40. The solar panel 140 and the solar panel 142 are each configured to convert ambient solar energy into electrical power usable to charge the energy storage device 62. In illustrated locations, the solar panel 140 and the solar panel 142 are each positioned in a transverse orientation to receive solar energy. Additionally, or alternatively, one or more solar panels could be located at other portions of the vehicle 10, such as at a window panel 20, for instance.

Additional energy harvesting devices 70 can be included with the vehicle 10 depending upon the availability of ambient energy at different locations about the vehicle 10 and the practicability of converting the available ambient energy into electrical power. As shown, for example, an additional energy harvesting device 144 could be located within the engine compartment 42 and configured to convert ambient thermal energy into electrical power.

According to the implementations where one or more energy harvesting devices 72 are included with the vehicle 10, the power pack 60 may be configured to support a disconnectable electrical coupling between the energy harvesting devices 72 and the energy storage device 62 of the power pack 60. In the illustrated example of the power pack 60, for instance, a plug 150 extending from the power pack 60 is configured for connection to a receptacle 152 in the bed 32 of the vehicle 10 to create a disconnectable conductive terminal connection between the energy storage device 62 and the solar panel 140 and the energy harvesting device 144. Alternatively, it will be understood that a non-conductive and disconnectable electrical coupling could be used. In addition, an inductive pad 154 is located along the side face 100c of the housing 80 of the battery pack 60 for alignment with an inductive pad 156 located on the tonneau cover 40 when the tailgate 16f is in its closed position to create a non-conductive and disconnectable electrical coupling between the energy storage device 62 and the solar panel 142. Alternatively, it will be understood that a disconnectable conductive terminal connection could be used.

While recited characteristics and conditions of the invention have been described in connection with certain embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An automotive vehicle having a battery, comprising:
   an exterior vehicle panel of the automotive vehicle defining a recess within a surface of the exterior vehicle panel; and
   a portable power pack removably mounted within the recess, the power pack including:
      a solar panel for converting solar energy into electrical power,
      a storage device in communication with the solar panel for storing energy in response to the electrical power, and
      an output interface in communication with the storage device for supplying the stored energy to an electronic device.

2. The vehicle of claim 1, further comprising:
   a powered vehicle accessory that includes the electronic device, wherein the output interface at least partially forms a disconnectable electrical coupling between the storage device and the electronic device.

3. The vehicle of claim 1, wherein the electronic device is a consumer electronic device and the output interface is configured to at least partially form a disconnectable electrical coupling between the storage device and the consumer electronic device.

4. The vehicle of claim 1, wherein the portable power pack defines an exterior surface of the vehicle panel when housed in the recess, with the exterior surface being generally flush with the vehicle panel when the portable power pack is mounted in the recess.

5. The vehicle of claim 4, wherein the exterior surface of the portable power pack includes a generally planar work surface.

6. The vehicle of claim 1, further comprising:
   a second energy storage device separate from the portable power pack; and
   a disconnectable electrical coupling between the second energy storage device and the energy storage device included in the portable power pack.

7. The vehicle of claim 1, further comprising:
   an energy harvesting device separate from the portable power pack; and
   a disconnectable electrical coupling between the energy harvesting device and the energy storage device.

8. The vehicle of claim 1, wherein the portable power pack includes a locking mechanism for selectively locking the portable power pack within the recess of the vehicle panel.

9. The vehicle of claim 1, wherein the portable power pack further includes a device configured for converting vibration energy into electrical power.

10. The vehicle of claim 1, wherein the electronic device is located on the exterior vehicle panel and the portable power pack powers the electronic device when the portable power pack is mounted within the recess.

11. The vehicle of claim 1, wherein the electronic device is remote from the vehicle and the portable power pack powers the electronic device when the portable power pack is removed from the recess.

12. The vehicle of claim 1, wherein the electronic device is located within a vehicle accessory within the vehicle and the portable power pack powers the electronic device when the portable power pack is mounted within the recess.

13. A vehicle, comprising:
   a tailgate of the vehicle configured for removable attachment from a remainder of the vehicle;
   a powered vehicle accessory supported on or in the tailgate, the powered vehicle accessory including at least one electronic device;
   a power pack removably mounted to the tailgate, the power pack including:
      a solar panel for converting solar energy into electrical power, and
      a storage device in communication with the solar panel for storing energy in response to the electrical power; and
   a disconnectable electrical coupling between the storage device and the electrical device of the powered vehicle accessory on or in the tailgate.

14. The vehicle of claim 13, wherein the powered vehicle accessory includes one of a light, a backup camera or a powered lock supported on or in the tailgate.

15. The vehicle of claim 13, wherein the power pack further includes a device configured for converting vibration energy into electrical power.

16. A vehicle powered at least in part by a battery, comprising:
   an exterior vehicle panel defining a recess within a surface of the exterior vehicle panel; and
   a portable power pack removably mounted within the recess, the power pack including:
      a solar panel for converting solar energy into electrical power,
      a storage device in communication with the solar panel for storing energy in response to the electrical power, and
   an output interface in communication with the storage device for supplying the stored energy to the battery of the vehicle when the portable power pack is mounted within the recess.

17. The vehicle of claim 16, wherein the portable power pack further includes a device configured for converting vibration energy into electrical power.

* * * * *